(12) United States Patent
Ku et al.

(10) Patent No.: US 11,487,326 B2
(45) Date of Patent: Nov. 1, 2022

(54) ELEVATED DOCKING STATION FOR DIFFERENT MOBILE DEVICES

(71) Applicant: Intel Corporation, Santa Clara, CA (US)

(72) Inventors: Jeff Ku, Taipei (TW); Tin Poay Chuah, Bayan Baru Pulau Pinang (MY); Yew San Lim, Gelugor Pulau Pinang (MY); Min Suet Lim, Gelugor Pulau Pinang (MY); Chee Chun Yee, Bayan Lepas Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 17/088,611

(22) Filed: Nov. 4, 2020

(65) Prior Publication Data
US 2022/0066506 A1    Mar. 3, 2022

(30) Foreign Application Priority Data
Aug. 28, 2020  (MY) .............................. PI2020004463

(51) Int. Cl.
| G06F 1/16 | (2006.01) |
| G06F 13/42 | (2006.01) |
| H05K 7/20 | (2006.01) |
| G06F 1/20 | (2006.01) |

(52) U.S. Cl.
CPC ............ *G06F 1/1632* (2013.01); *G06F 1/203* (2013.01); *G06F 13/4282* (2013.01); *H05K 7/20136* (2013.01); *G06F 2213/0042* (2013.01)

(58) Field of Classification Search
CPC .... H02J 7/0044; G06F 1/1632; G06F 1/1654; H05K 7/1427; H05K 5/0217

USPC ............ 361/679.41, 679.43, 679.02, 679.58; 710/303, 304

See application file for complete search history.

(56) References Cited

U.S. PATENT DOCUMENTS

| 6,453,378 B1 * | 9/2002 | Olson ...................... G06F 1/203 |
| | | 361/679.55 |
| 8,780,546 B2 * | 7/2014 | Zhou ...................... H01R 27/00 |
| | | 361/679.41 |
| 9,429,994 B1 * | 8/2016 | Vier ........................ G06F 1/1632 |
| 2003/0128510 A1 * | 7/2003 | Anzai ........................ G06F 1/18 |
| | | 361/679.48 |
| 2012/0254493 A1 * | 10/2012 | Wang ...................... G06F 1/1632 |
| | | 710/303 |
| 2014/0098486 A1 * | 4/2014 | Davis .................... G06F 1/1607 |
| | | 361/679.41 |

(Continued)

OTHER PUBLICATIONS

E-Port II—Visual Guide to your Dock, https://www.dell.com/support/article/en-us/sln285009/e-port-ii-visual-guide-to-your-dock?lang=en, retrieved on Aug. 25, 2020.

(Continued)

*Primary Examiner* — Mandeep S Buttar
(74) *Attorney, Agent, or Firm* — Viering, Jentschura & Partner MBB

(57) ABSTRACT

The present disclosure relates to a docking station including a triangular prism shaped body, and a cradle proximal to a top section of the triangular prism shaped body for detachably receiving a mobile device, wherein the cradle may include a plurality of different connection interfaces to provide a selectable connection with a complementary connection interface of the mobile device.

17 Claims, 14 Drawing Sheets

(56) References Cited

U.S. PATENT DOCUMENTS

| | | | | |
|---|---|---|---|---|
| 2015/0185773 A1* | 7/2015 | Vroom | .................. | G06F 1/1632 |
| | | | | 361/679.41 |
| 2015/0222138 A1* | 8/2015 | Amano | .................. | H02J 50/80 |
| | | | | 320/108 |
| 2017/0153667 A1* | 6/2017 | Suckle | .................. | G06F 1/1632 |
| 2017/0161212 A1* | 6/2017 | Campbell | ............. | G06F 1/3293 |
| 2017/0208697 A1* | 7/2017 | Kurian | .................. | G06F 1/1632 |
| 2020/0379514 A1* | 12/2020 | Lam | ........................ | G06F 1/163 |

OTHER PUBLICATIONS

Use Surface docking station, https://support.microsoft.com/en-us/help/4023452/use-surface-docking-station, retrieved on Aug. 25, 2020.

Laser 100W USB-C Type-C Docking Station for Apple MacBook Pro, https://www.gadgets4geeks.com.au/laser-100w-usb-type-c-docking-station-ethernet-sd-card-hdmi-for-macbook, retrieved on Aug. 25, 2020.

Razer Launches Core X Chroma TB3 eGFX Enclosure: 700 W, GbE, USB, https://www.anandtech.com/print/14242/razer-launches-core-x-chroma-tb3-egfx-enclosure-700-w-gbe-usb, retrieved on Aug. 25, 2020.

Dell Rugged Tablet Dock, https://www.dell.com/en-ca/work/shop/dell-rugged-tablet-dock/apd/470-abnj/power-cooling-data-center-infrastructure#tabs_section, retrieved on Aug. 25, 2020.

Superuser, How can I check if my Dell has a dock port?, https://superuser.com/questions/656603/how-can-i-check-if-my-dell-has-a-dock-port/656607, retrieved on Aug. 25, 2020.

* cited by examiner

ELEVATED DOCKING STATION FOR DIFFERENT MOBILE DEVICES

CROSS-REFERENCE TO RELATED APPLICATIONS

This application claims priority to Malaysian Application No. P12020004463, filed on Aug. 28, 2020, which is incorporated by reference herein in its entirety.

BACKGROUND

Owners of mobile devices typically like the versatility mobile devices bring since they need not be confined to a particular location. For example, a laptop owner may carry along with him/her the laptop to work at any location whereas a desktop owner is more likely to be restricted to where the desktop is located.

However, a laptop may not handle many devices or peripherals at once. A laptop docking station may ease this issue to a certain extent. Docking stations may allow multiple input/output (I/O) ports, for example. Docking stations are manufactured by different manufacturers and are designed for their specific laptop designs. Thus, if a laptop owner changes to another laptop made by a different manufacturer, the docking station made by the previous manufacturer may then become useless. This may also be true even if a laptop owner purchases a newer laptop model from the same manufacturer, due to hardware design changes made to the newer laptop model.

Furthermore, mobile device owners generally own more than one type of mobile device. For example, an owner may have a laptop for work purposes, another laptop for personal use, a tablet for leisure purposes, and/or a mobile phone for social purposes. These mobile devices may or may not originate from the same manufacturer. Even if they do, as mentioned above, a docking station for one type of mobile device may not be suitable for another type of mobile device.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include delivering a universal docking station for consumers who may own different mobile devices, such as laptops, tablets, and mobile phones. Unifying the docking station for a product family may like to improve the customer brand stickiness and further encourage consumers to purchase more products from the product family as the docking station can be leveraged.

Another advantage of the present disclosure may include providing a better ergonomic and thermal performance for a dual display and a companion display system.

The present disclosure generally relates to a docking station including a triangular prism shaped body and a cradle proximal to a top section of the triangular prism shaped body for detachably receiving a mobile device, wherein the cradle comprises a plurality of different connection interfaces to provide a selectable connection with a complementary connection interface of the mobile device. In one aspect, the cradle may include two different connection interfaces, such as a universal serial bus type C (USB-C) connector and an original equipment manufacturer (OEM) customized male connector. There may be more than two different connection interfaces, each with a different connection interface. The cradle may be configured to include a recess for receiving a mobile device. In one aspect, the cradle may include a recess for receiving an edge of a mobile device for docking.

In various aspects of the present disclosure, the docking station may further include a printed circuit board arranged in an interior of the triangular prism shaped body.

In various aspects of the present disclosure, the docking station may further include a cooling system arranged in an interior of the triangular prism shaped body.

To more readily understand and put into practical effect the present disclosure, particular aspects will now be described by way of examples and not limitations, and with reference to the drawings. For the sake of brevity, duplicate descriptions of features and properties may be omitted.

Figure 1:
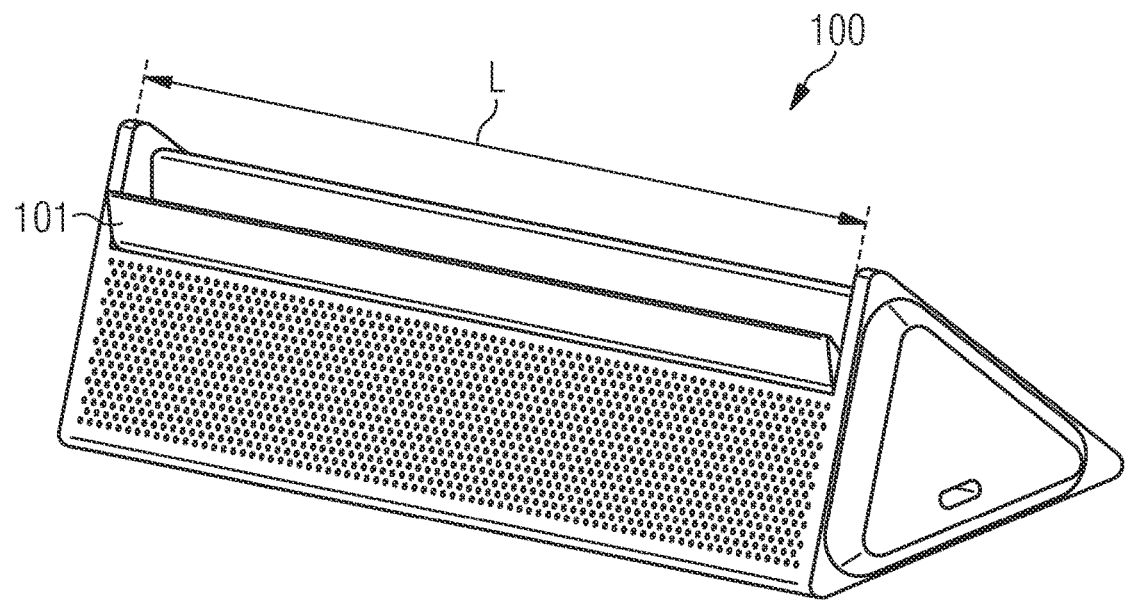
FIG. 1 shows a perspective view of a docking station according to an aspect of the present disclosure.

FIG. 1 shows a perspective view of a docking station 100 according to an aspect of the present disclosure.

In one aspect, the docking station 100 may include a triangular prism shaped cross-section. The docking station may further include a cradle 101 positioned near (i.e., proximal) the top of the docking station 100 when in use. The cradle 101 may be configured to detachably receive an edge of a mobile device, such as a laptop, a tablet, or a mobile phone.

In one aspect, the cradle 101 may include a length (L) that runs along a body length of the docking station 100. For example, the cradle 101 may include a length of at least 12 inches for accommodating a laptop of 12 inches or less. In other examples, the cradle 101 may include a length of more than 12 inches. In one aspect, the length of the cradle 101 may be fixed. In another aspect, the length of the cradle 101 may be variable. For example, the cradle may be retracted or extended along its length to accommodate a dimension of the mobile device for a more secure docking position. The docking station 100 may likewise be retractable for a more compact design, for example, during storage or non-use.

Figure 2A:
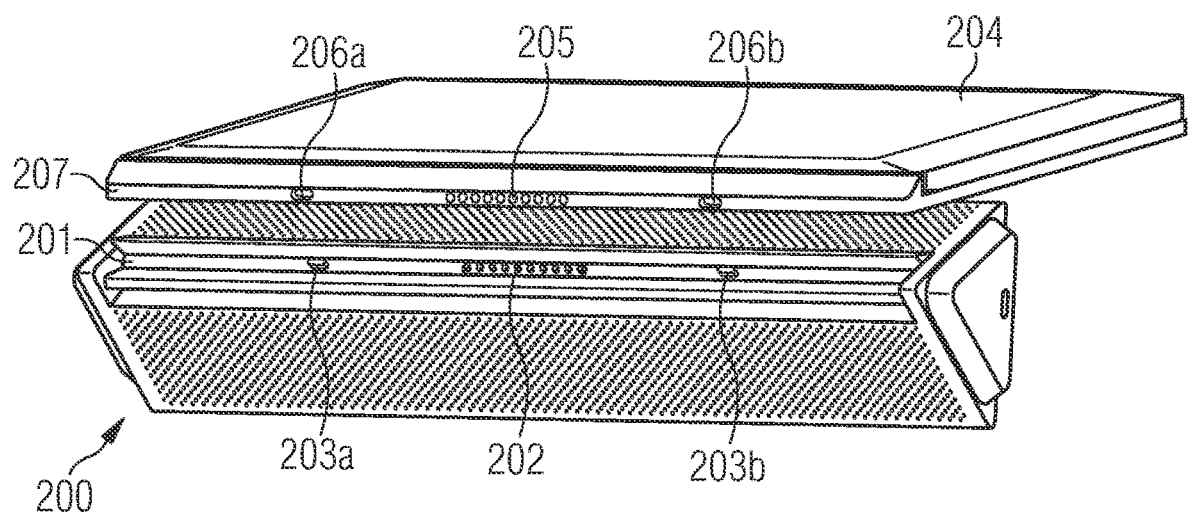
FIGS. 2A through 2C show perspective views of a docking station with various fixed connection interface options according to an aspect of the present disclosure.
Figure 2B:
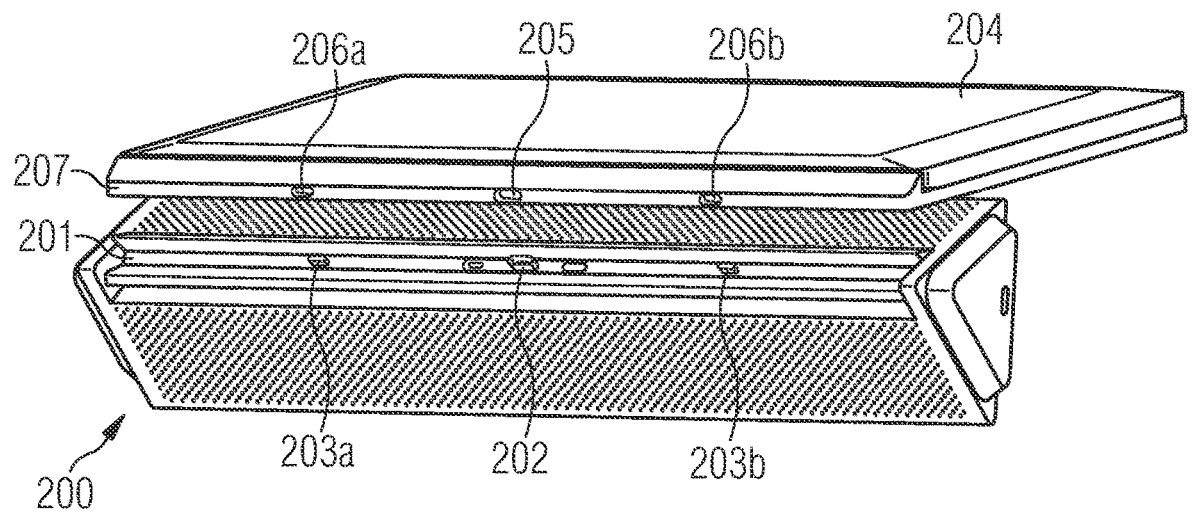
Figure 2C:
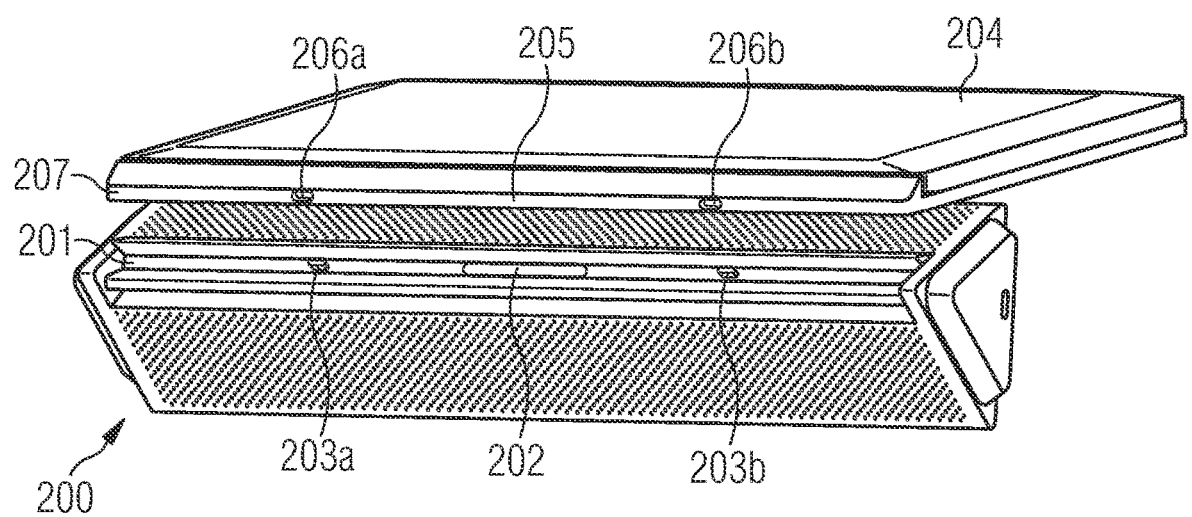

FIGS. 2A through 2C show perspective views of a docking station with various fixed connection interface options according to an aspect of the present disclosure.

In the aspect shown in FIG. 2A, a cradle connection interface 202 may be provided in the cradle 201. The cradle connection interface 202 may be conveniently located in the cradle 201, such as in the center. In one aspect, the cradle connection interface 202 may include a pogo pin connection.

The cradle 201 may further include a pair of guiding pins (203a, 203b) positioned close to the cradle connection interface 202.

In the aspect shown in FIG. 2A, a laptop connection interface 205 may be provided on a docking edge 207 of a laptop 204. The laptop connection interface 205 may be conveniently located on the docking edge 207, such as in the center.

The docking edge 207 of the laptop 204 may further include a pair of guiding recess (206a, 206b).

During docking of the laptop 204 to the docking station 200, the guiding pins (203a, 203b) may guide a user to engage the docking edge 207 of the laptop 204 to the cradle 201 of the docking station 200. The laptop 204 may be engaged or docked to the docking station 200 via the pair of guiding pins (203a, 203b) and the guiding recesses (206a, 206b).

Once docked, the cradle connection interface 202 may mate with the laptop connection interface 205 to form a connection, thereby allowing communication between the laptop 204 and the docking station 200.

In the aspect shown in FIG. 2B, a cradle connection interface 202 may be provided in the cradle 201. The cradle connection interface 202 may be conveniently located in the cradle 201, such as in the center. In one aspect, the cradle connection interface 202 may include a USB-C (universal serial bus type C) connection.

The cradle 201 may further include a pair of guiding pins (203a, 203b) positioned close to the cradle connection interface 202.

In the aspect shown in FIG. 2B, a laptop connection interface 205 may be provided on a docking edge 207 of a laptop 204. The laptop connection interface 205 may be conveniently located on the docking edge 207, such as in the center.

The docking edge 207 of the laptop 204 may further include a pair of guiding recess (206a, 206b).

During docking of the laptop 204 to the docking station 200, the guiding pins (203a, 203b) may guide a user to engage the docking edge 207 of the laptop 204 to the cradle 201 of the docking station 200. The laptop 204 may be engaged or docked to the docking station 200 via the pair of guiding pins (203a, 203b) and the guiding recesses (206a, 206b).

Once docked, the cradle connection interface 202 may mate with the laptop connection interface 205 to form a connection, thereby allowing communication between the laptop 204 and the docking station 200.

In the aspect shown in FIG. 2C, a cradle connection interface 202 may be provided in the cradle 201. The cradle connection interface 202 may be conveniently located in the cradle 201, such as in the center. In one aspect, the cradle connection interface 202 may include a wireless high-speed connection.

The cradle 201 may further include a pair of guiding pins (203a, 203b) positioned close to the cradle connection interface 202.

In the aspect shown in FIG. 2C, a laptop connection interface 205 may be provided on a docking edge 207 of a laptop 204. The laptop connection interface 205 may be conveniently located on the docking edge 207, such as in the center.

The docking edge 207 of the laptop 204 may further include a pair of guiding recess (206a, 206b).

During docking of the laptop 204 to the docking station 200, the guiding pins (203a, 203b) may guide a user to engage the docking edge 207 of the laptop 204 to the cradle 201 of the docking station 200. The laptop 204 may be engaged or docked to the docking station 200 via the pair of guiding pins (203a, 203b) and the guiding recesses (206a, 206b).

Once docked, the cradle connection interface 202 may mate with the laptop connection interface 205 to form a connection, thereby allowing communication between the laptop 204 and the docking station 200.

Figure 3A:
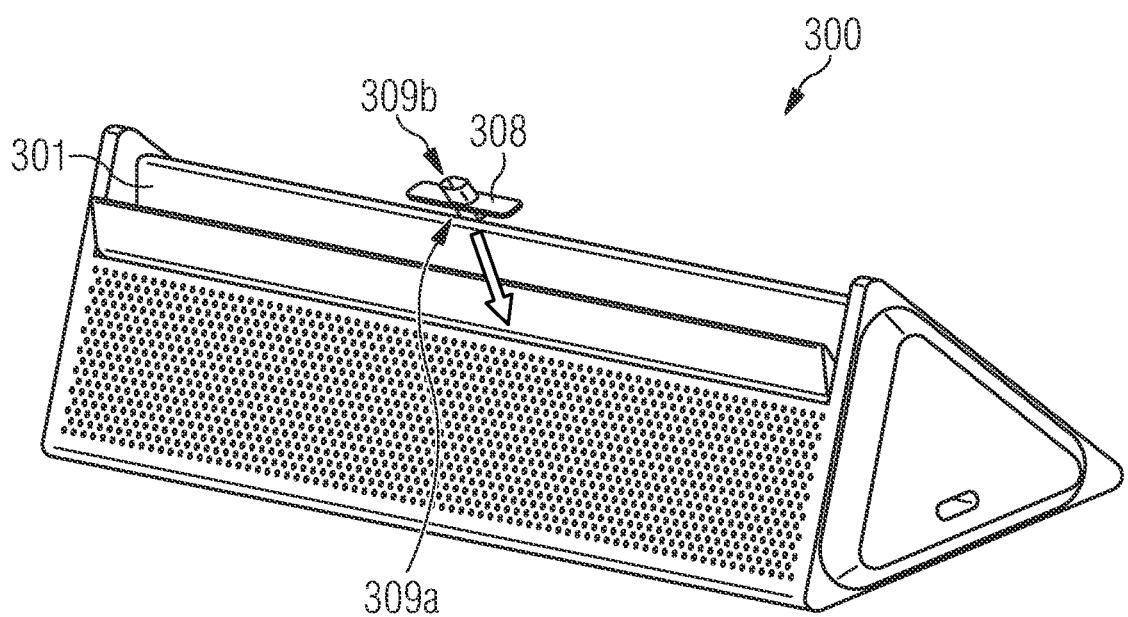
FIG. 3A shows a perspective view of a docking station with a swappable connection interface option according to an aspect of the present disclosure.

FIG. 3A shows a perspective view of a docking station with a swappable connection interface option according to an aspect of the present disclosure.

In the aspect shown in FIG. 3A, a convertor module 308 may be provided. The converter module may be a separate workpiece from the docking station 300. The converter module 308 may engage at a location of the cradle 308.

The converter module 308 may include a first converter module connection interface 309a on one side. The converter module 308 may further include a second convertor module connection interface 309b on another opposing side.

The first converter module connection interface 309a may be configured to connect to a cradle connection interface 302. The second converter module connection interface 309b may be configured to connect to a laptop connection interface. The converter module 308 may be inserted or engaged to the cradle connection interface 302 in the direction of the arrow shown in FIGS. 3A and 3B.

Figure 3B:
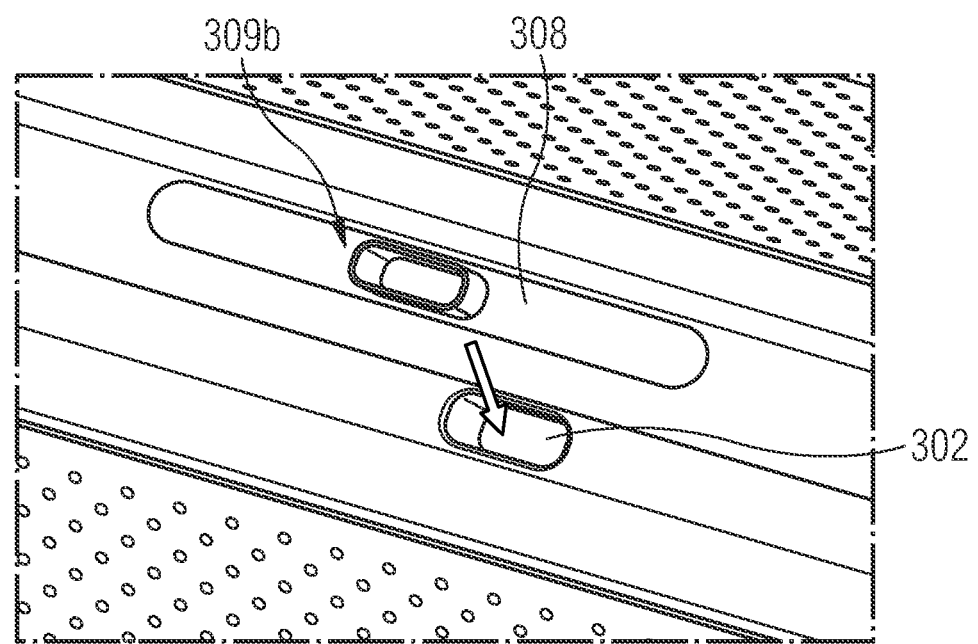
FIG. 3B shows an exploded view of the swappable connection interface option according to an aspect shown in FIG. 3A.

FIG. 3B shows an exploded view of the swappable connection interface option according to an aspect shown in FIG. 3A.

In the aspect shown in FIG. 3B, the cradle connection interface 302 may be configured to include a female USB-C port. Therefore, for mating purposes, the first converter module connection interface 309a may be configured to include a male USB-C port for insertion into the female USB-C port of the cradle connection interface 302.

The second converter module connection interface 309b may be configured according to the type of connection interface of a laptop. In one aspect, the converter module 308 may include an OEM (original equipment manufacturer) customized male connector.

The aspect shown in FIGS. 3A and 3B may be advantageous when a user could easily swap the docking ports and therefore render the docking station compatible with legacy or newer devices. By providing a cradle including a plurality of swappable different connection interfaces, the user may be provided with a selectable connection with a complementary connection interface of the mobile device.

Figure 4A:
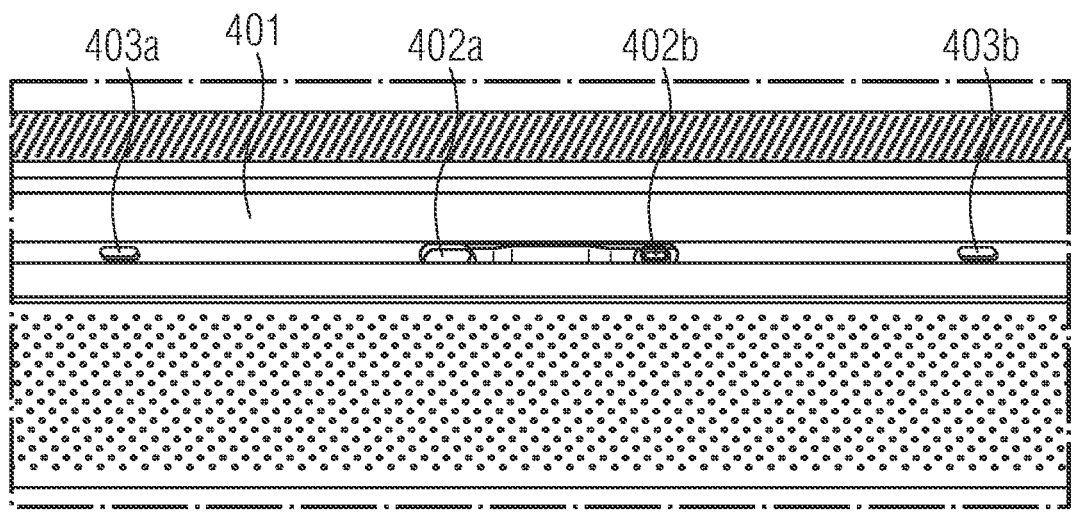
FIG. 4A shows a partial top view of a cradle of a docking station with fixed connection interface options according to an aspect of the present disclosure.

FIG. 4A shows a partial top view of a cradle of a docking station with fixed connection interface options according to an aspect of the present disclosure.

The cradle 401 may include a pair of different cradle connection interface (402a, 402b). The cradle 401 may further include a pair of guiding pins (403a, 403b) positioned close to the pair of different cradle connection interface (402a, 402b).

In the aspect shown in FIG. 4A, a first cradle connection interface 402a may include a male USB-C port. A second cradle connection interface 402b may include an OEM customized male port.

The aspect shown in FIG. 4A may be advantageous when an OEM mobile device may include two major connection interfaces on their product line, for example, one is USB-C, and another is their customized port. Therefore, the mobile devices in this product line may be compatible with a single docking station with both connection interfaces placed inside the docking station. In this aspect, the cradle may include a plurality of fixed connection interfaces, each including a predetermined connection interface. The cradle may also include a selective activation mechanism in the recess to expose one of the plurality of fixed different connection interfaces for connection with a complementary connection interface of a mobile device.

Figure 4B:
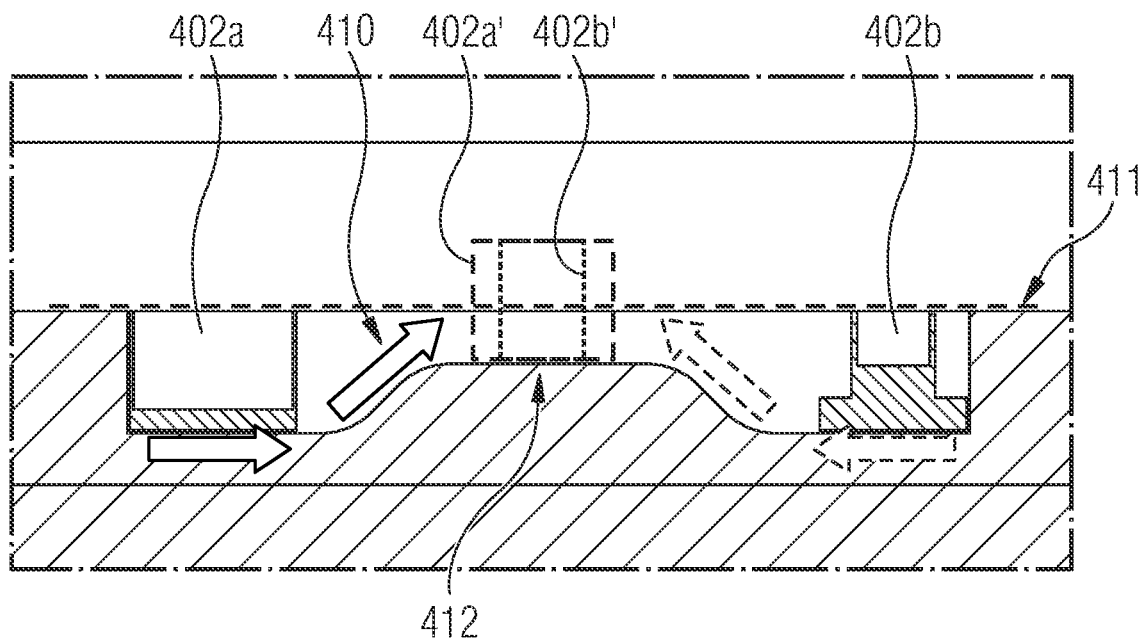
FIG. 4B shows a front view of a cradle of a docking station with fixed connection interface options according to an aspect shown in FIG. 4A.

FIG. 4B shows a front view of a cradle of a docking station with fixed connection interface options according to an aspect shown in FIG. 4A.

In one aspect of the present disclosure, the first cradle connection interface 402a may be arranged at a first position in a recess 410 of the cradle 401. The second cradle connection interface 402b may be arranged at a second position in a recess 410 of the cradle 401. Both the first and second cradle connection interfaces (402a, 402b) may be 'submerged' or hidden in the recess 410 during non-use of the docking station 401. In other words, a top surface of each of the first and second cradle connection interfaces (402a, 402b) may form a leveled plane with a top surface 411 of the cradle 401. In another aspect, the top surface of each of the first and second cradle connection interfaces (402a, 402b) may be lower than the top surface 411 of the cradle 401.

At any one time, either one of the first cradle connection interface 402a or the second cradle connection interface 402b may be selectively 'activated' and raised to expose the respective cradle connection interface (402a, 402b) above the top surface 411 of the cradle 401 during use.

In the aspect shown in FIG. 4B, the first cradle connection interface 402a may move in a direction of the solid arrow to slide up a raised section 412 in the recess 410 and stays in an active position shown in a dashed line 402a'. In this active mode, the top surface of the first cradle connection interface 402a may be above the top surface 411 of the cradle 401. During non-use, the first cradle connection interface 402a may move from the active position to an inactive position in the recess 410 by moving in a reverse direction and sliding down the raised section 412 to return to the first position in the recess 410.

In the aspect shown in FIG. 4B, the second cradle connection interface 402b may move in a direction of the hollow arrow to slide up a raised section 412 in the recess 410 and stays in an active position shown in a dashed line 402b'. In this active mode, the top surface of the second cradle connection interface 402b may be above the top surface 411 of the cradle 401. During non-use, the second cradle connection interface 402b may move from the active position to an inactive position in the recess 410 by moving in a reverse direction and sliding down the raised section 412 to return to the second position in the recess 410.

The aspect shown in FIGS. 4A and 4B may be advantageous for a user to easily access the cradle connection interface by selectively activating the sliding mechanism to expose the required connector.

Figure 5:
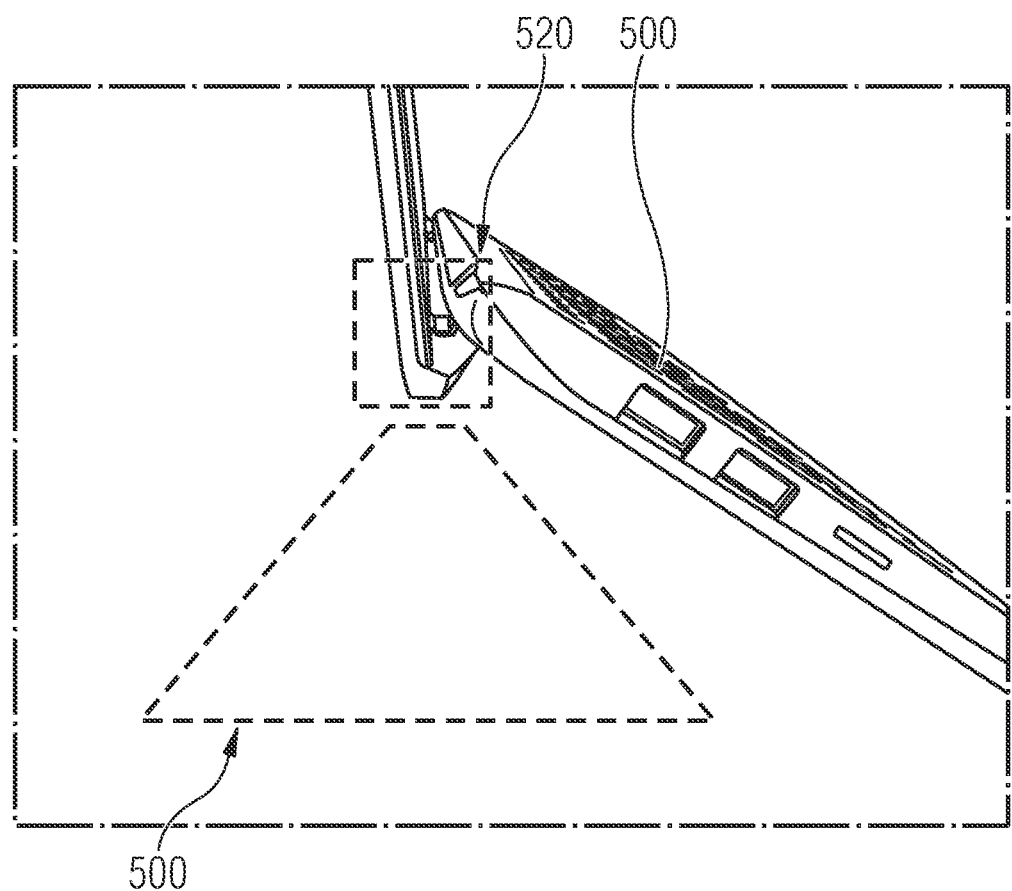
FIG. 5 shows a side view of a docking station during use according to an aspect of the present disclosure.

FIG. 5 shows a side view of a docking station 500 during use according to an aspect of the present disclosure.

In one aspect, the docking station 500 (shown in a dashed line) may be suitable for use with a laptop 520 including a drop hinge design 521. When the laptop lid is opened, the rear edge of the laptop lid goes under the base of the laptop 520 and may become a stand for elevating the laptop 520. In other words, the drop hinge design 521 may keep the laptop 520 slightly lifted when used on a desk to increase airflow from underneath, and for an elevated keyboard position for a better typing position. The laptop 520 may be positioned such that a rear edge of the laptop may sit in the cradle of the docking station 500.

Figure 6A:
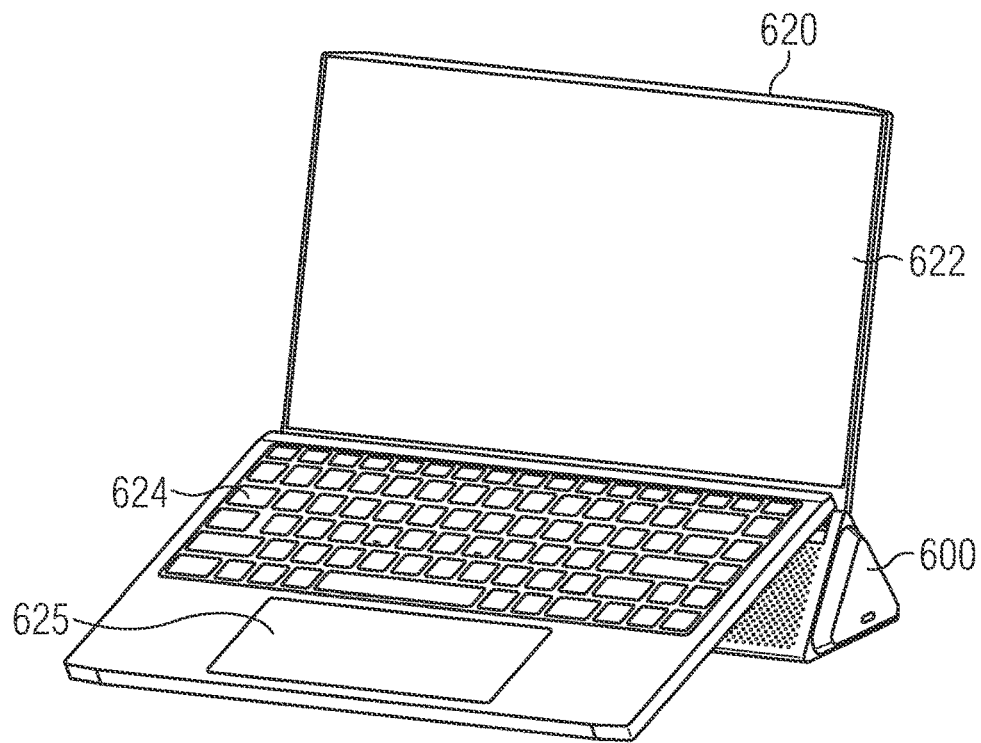
FIG. 6A shows a perspective view of a docking station during use with a conventional laptop design according to an aspect of the present disclosure.

FIG. 6A shows a perspective view of a docking station 600 during use with a conventional laptop design according to an aspect of the present disclosure.

The laptop 620 may include a display panel 622, a keyboard 624, and a trackpad 625. The laptop 620 may further include a drop hinge design at a rear edge.

In the aspect shown in FIG. 6A, the laptop 620 may sit in a cradle of the docking station 600 during use. In this configuration, the docking station 600 may provide an elevated typing position for the user for better ergonomics. At the same time, the docking station 600 may provide an elevated position for better cooling capability.

Figure 6B:
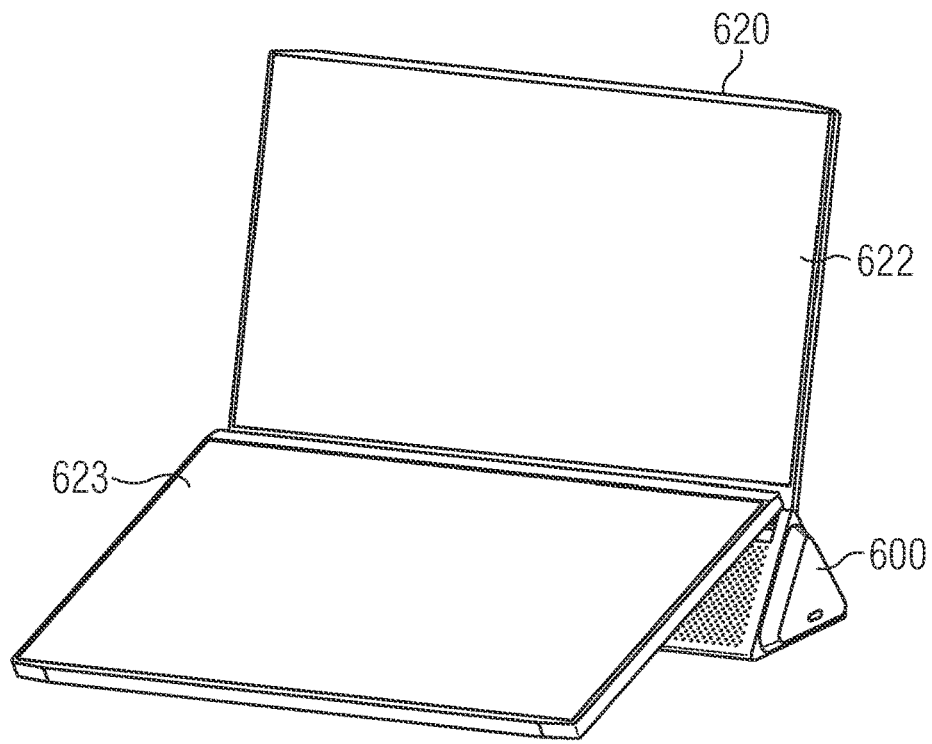
FIG. 6B shows a perspective view of a docking station during use with a different laptop design according to an aspect of the present disclosure.

FIG. 6B shows a perspective view of a docking station during use with a different laptop design according to an aspect of the present disclosure.

The laptop 620 may include a first display panel 622 and a second display panel 623. The second display panel 623 may replace a keyboard and/or a trackpad. The laptop 620 may further include a drop hinge design at a rear edge.

In the aspect shown in FIG. 6B, the laptop 620 may sit in a cradle of the docking station 600 during use. In this configuration, the docking station 600 may provide an elevated typing position for the user for better ergonomics. At the same time, the docking station 600 may provide an elevated viewing angle of the second display panel 623 for better readability. The docking station 600 may further provide an elevated position for better cooling capability.

Figure 6C:
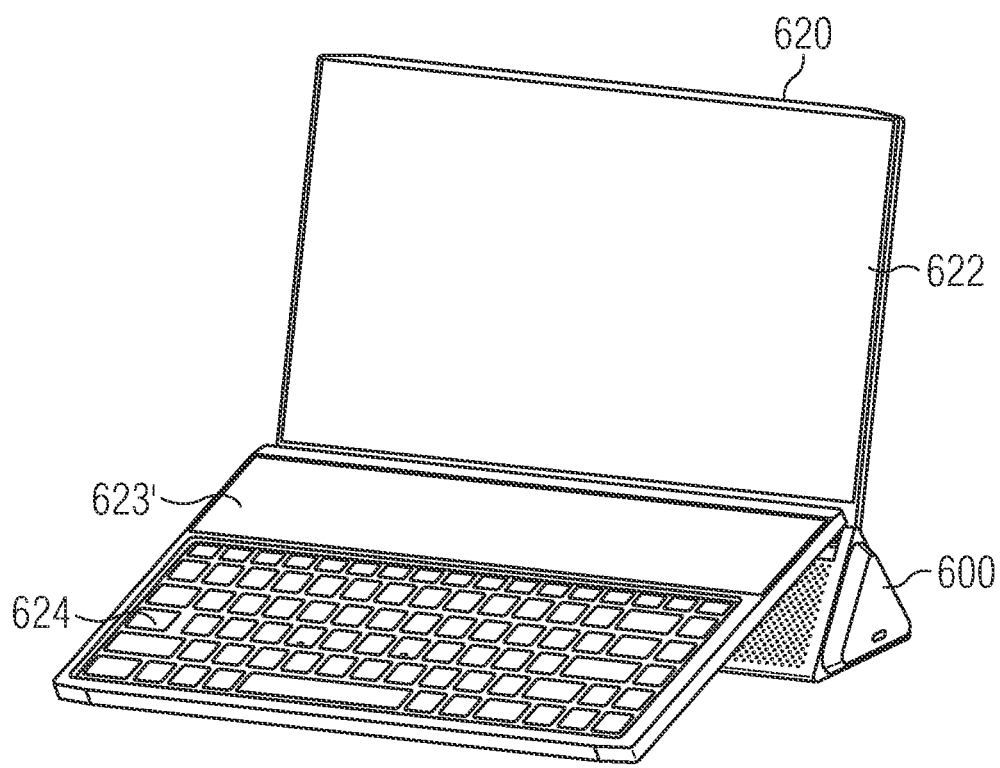
FIG. 6C shows a perspective view of a docking station during use with a further laptop design according to an aspect of the present disclosure.

FIG. 6C shows a perspective view of a docking station during use with a further laptop design according to an aspect of the present disclosure.

The laptop 620 may include a first display panel 622 and a second companion display panel 623'. The second companion display panel 623 may be smaller than the first display panel 622. The laptop 620 may further a keyboard 624. The laptop 620 may further include a drop hinge design at a rear edge.

In the aspect shown in FIG. 6C, the laptop 620 may sit in a cradle of the docking station 600 during use. In this configuration, the docking station 600 may provide an elevated typing position for the user for better ergonomics. At the same time, the docking station 600 may provide an elevated viewing angle of the second companion display panel 623' for better readability. The docking station 600 may further provide an elevated position for better cooling capability.

Figure 6D:
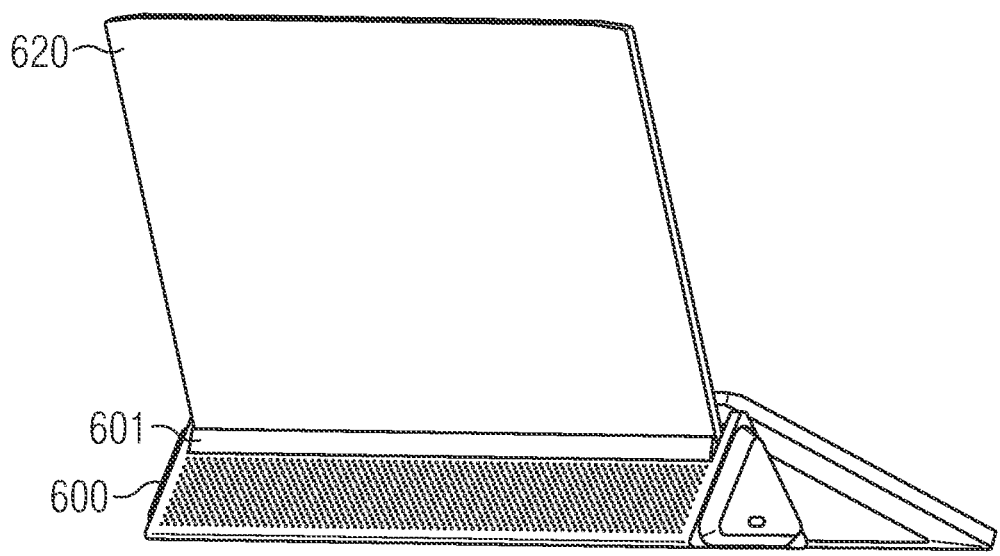
FIG. 6D shows a perspective view of a docking station during use with a laptop according to an aspect of the present disclosure.

FIG. 6D shows a perspective view of a docking station during use with a laptop according to an aspect of the present disclosure.

In the aspect shown in FIG. 6D, the rear of the docking station 600 and the laptop 620 may be seen. A rear edge of the laptop 620 sits in the cradle 601 of the docking station 600.

Figure 6E:
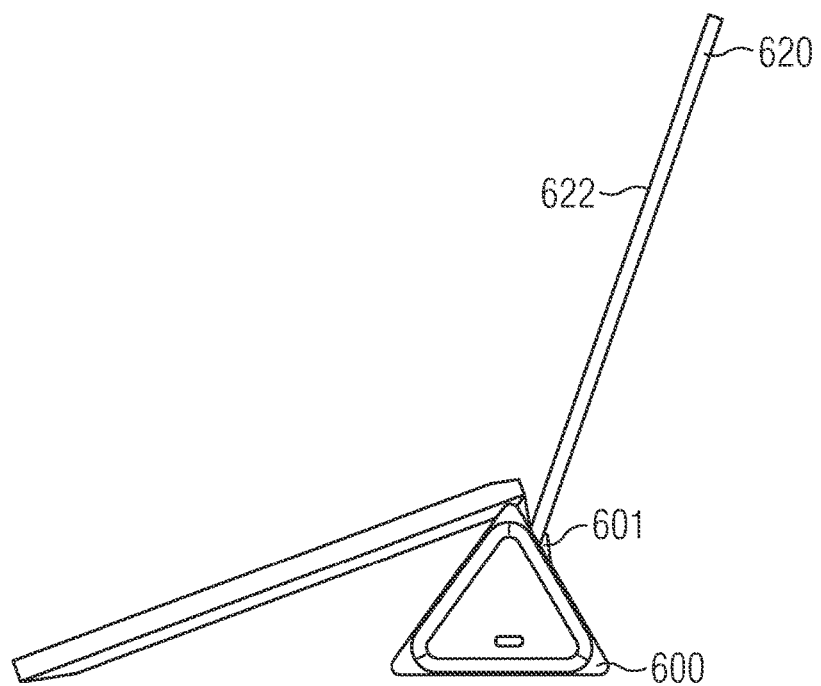
FIG. 6E shows a side view of a docking station during use with a laptop according to an aspect of the present disclosure.

FIG. 6E shows a side view of a docking station 600 during use with a laptop 620 according to an aspect of the present disclosure.

In the aspect shown in FIG. 6E, when the laptop 620 is docked to the cradle 601 of the docking station 600, the first display panel 622 may be tilted backwardly (i.e., away from a user) to adjust the viewing angle. The cradle 601 may adapt to this tilting action by tilting or rocking correspondingly and stay in the tilted position.

Figures 7A, 7B:
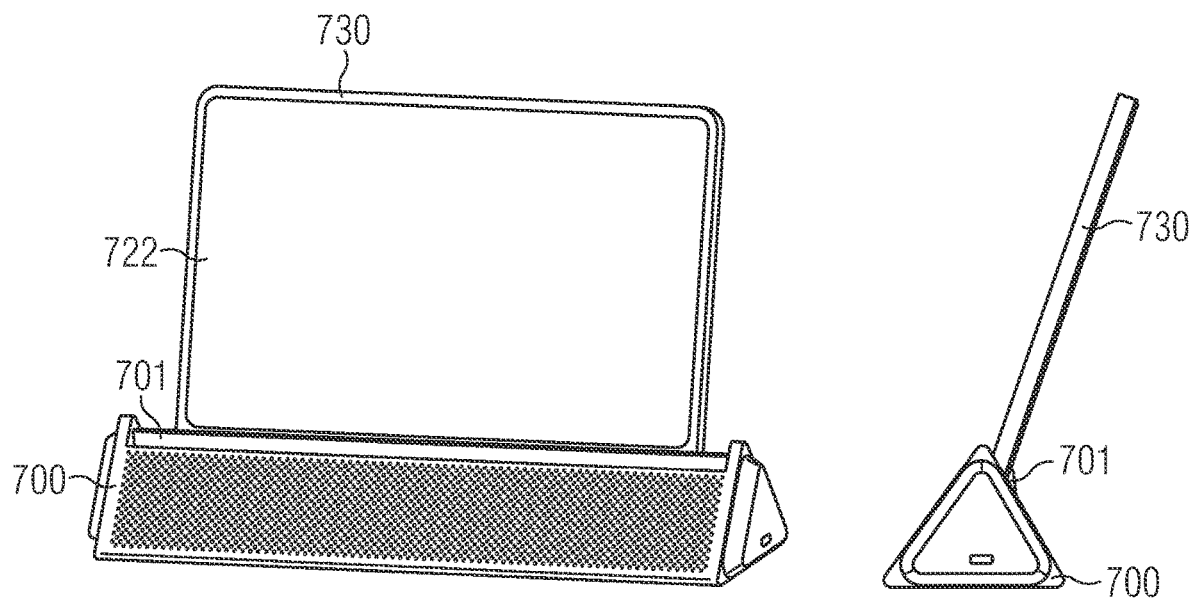
FIG. 7A shows a perspective view of a docking station during use with a tablet according to an aspect of the present disclosure.
FIG. 7B shows a side view of a docking station during use with a tablet according to an aspect of the present disclosure.

FIG. 7A shows a perspective view of a docking station 700 during use with a tablet 730 according to an aspect of the present disclosure.

The tablet 730 may include a display panel 722 facing a user. The tablet 730 may be docked to a cradle 701 of the docking station 700.

FIG. 7B shows a side view of a docking station 700 during use with a tablet 730 according to an aspect of the present disclosure.

In the aspect shown in FIG. 7B, when the tablet 730 is docked to the cradle 701 of the docking station 700, the display panel 722 may be tilted backwardly (i.e., away from a user) to adjust the viewing angle. The cradle 701 may adapt to this tilting action by tilting or rocking correspondingly and stay in the tilted position. In another aspect, a mobile phone instead of a tablet may be docked to the cradle 701 of the docking station 700 in a similar manner.

Figure 8A:
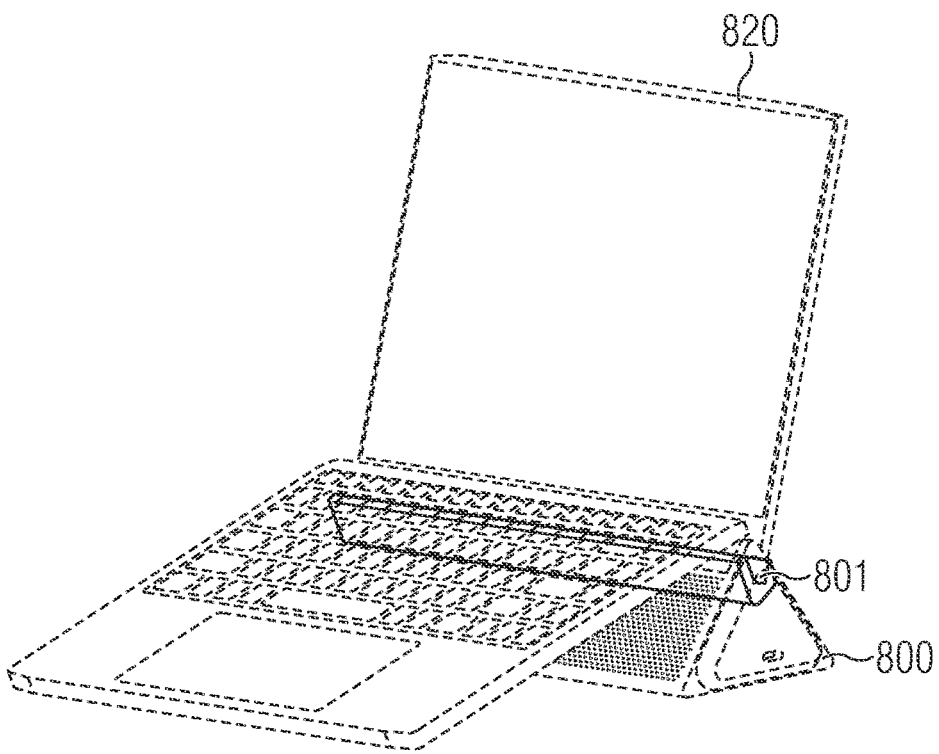
FIG. 8A shows a perspective view of a docking station during use with a laptop according to an aspect of the present disclosure.

FIG. 8A shows a perspective view of a docking station 800 during use with a laptop 820 according to an aspect of the present disclosure.

The docking station 800 may include a cradle 801 located at a top section of the docking station 800. In one aspect, the cradle 801 may be secured to the top section of the docking station 800 by a hinge (not shown). The hinged cradle 801 may allow users to adjust the display viewing angle within a certain range as long as the docked laptop does not tip over. Other fastening or securing means may also be suitable, so long as the cradle 801 may be able to rotate, rock, or tilt in response to an adjustment of the viewing angle.

Figure 8B:
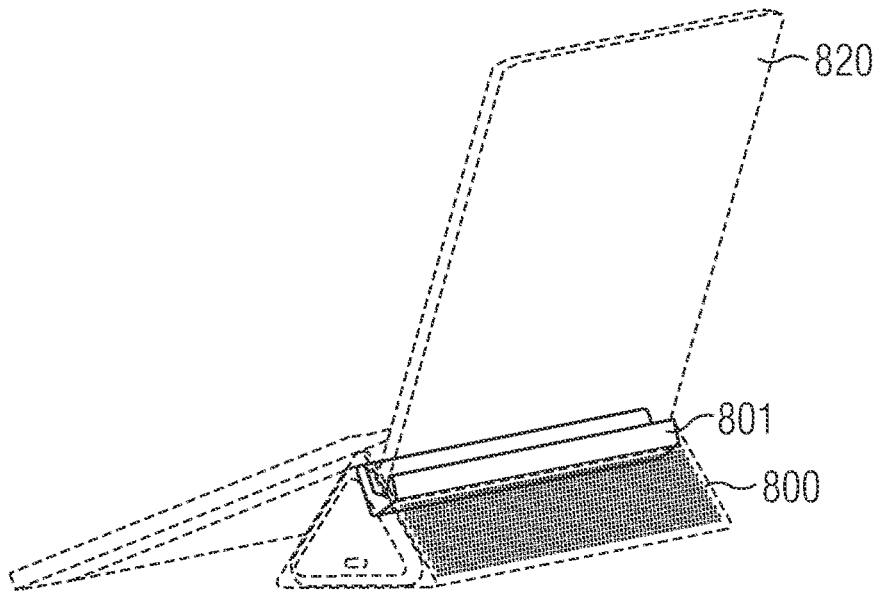
FIG. 8B shows a perspective view of a docking station during use with a laptop according to an aspect of the present disclosure.

FIG. 8B shows a perspective view of a docking station during use with a laptop according to an aspect of the present disclosure.

From the rearview, it may be seen a rear edge of the laptop 820 may sit in the cradle 801. In one aspect, the rear edge of the laptop 820 may occupy the entire length of the cradle 802. In other aspects, an edge of a mobile device, e.g., a tablet or a mobile phone, may occupy a partial length of the cradle 802.

Figure 9A:
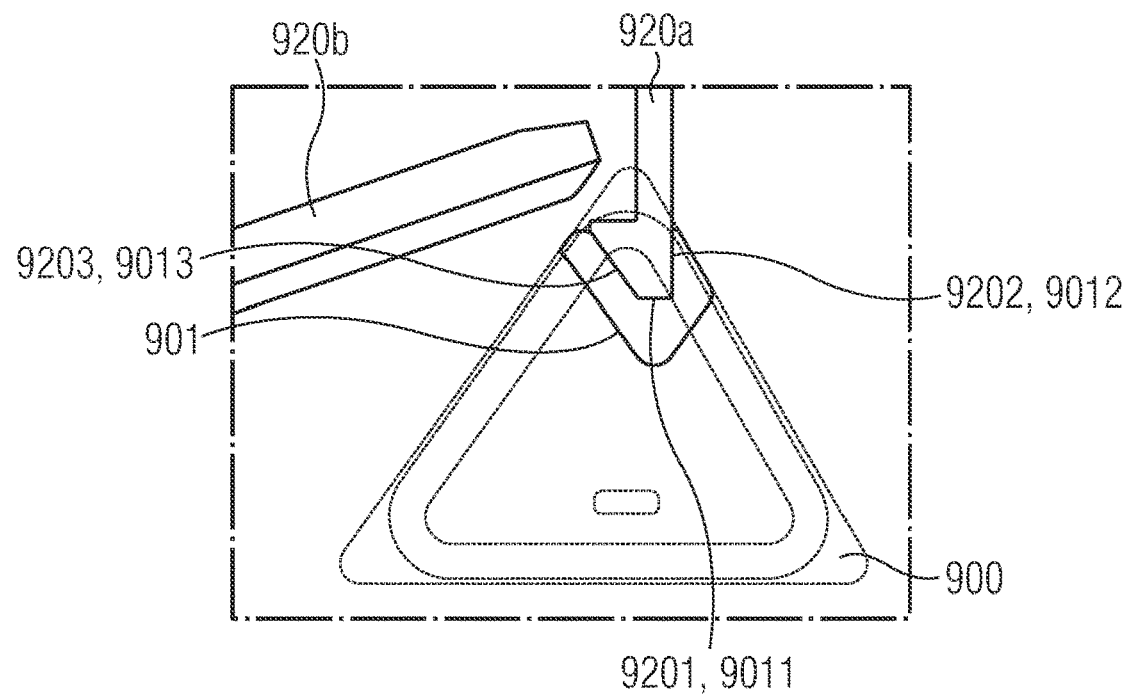
FIG. 9A shows an exploded side view of a cradle during use with a laptop according to an aspect of the present disclosure.

FIG. 9A shows an exploded side view of a cradle 901 during use with a laptop according to an aspect of the present disclosure.

In the aspect shown in FIG. 9A, a laptop may include a lid 920a and a base 920b attached to each other by a drop hinge design described above. In this figure, the base 920b is shown not to attach to the lid 920a for clarity purpose, so as not to obscure the area around the connection between the cradle 901 and the lid 920a.

From a side view perspective, the lid 920a may include a rear edge that may sit in the cradle 901. A cross-section of the rear edge may include a flat base 9201, a vertical sidewall 9202, and an inclined side wall 9203. The flat base wall 9201 may adjoin the vertical sidewall 9202 and the inclined side wall 9203. In one aspect, the cross-section of the lid 920a may include a 'hook' or "J" shape.

To receive the rear edge of the lid 920a, the cradle 901 may be suitably shaped to correspond to the cross-section of the rear edge. In one aspect, a cross-section of the cradle 901 may include a flat base 9011, a vertical sidewall 9012, and an inclined side wall 9013. The flat base 9011 may adjoin the vertical sidewall 9012 and the inclined side wall 9013. In one aspect, the cross-section of the cradle 901 may include a 'hook' or "J" shape. In one aspect, the cross-section of the cradle may be shaped to fit a laptop, in particular the hinge compartment of the laptop having a drop hinge design.

Figure 9B:
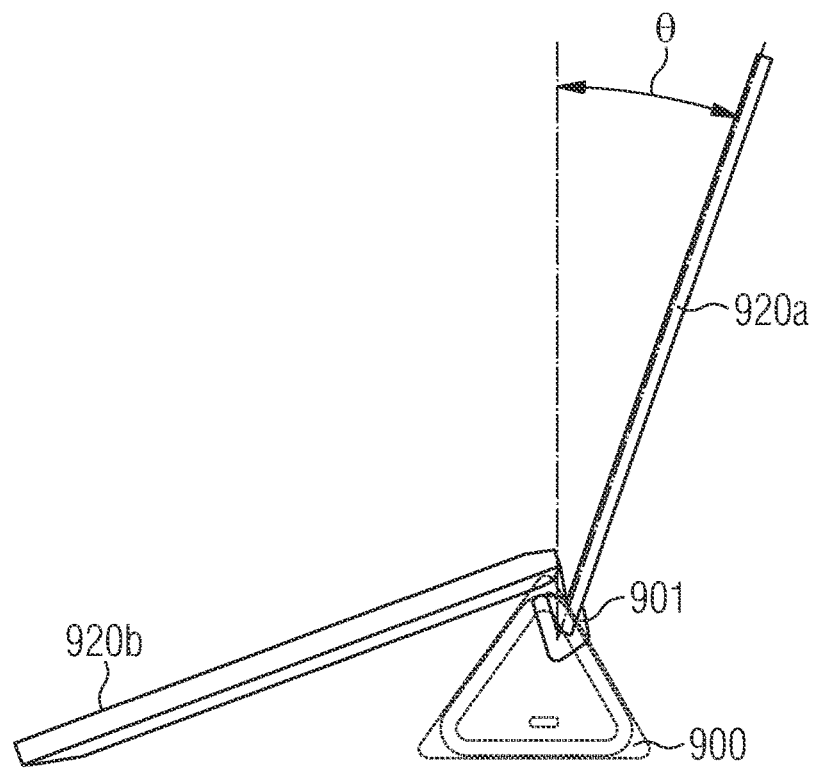
FIG. 9B shows a side view of a docking station during use with a laptop according to an aspect of the present disclosure.

FIG. 9B shows a side view of a docking station during use with a laptop according to an aspect of the present disclosure.

In the aspect shown in FIG. 9B, the lid 920a may be adjusted according to a choice of viewing angle (denoted by "θ") by a user. In one aspect, the viewing angle (θ) may be adjusted up to 125°. In other aspects, the view angle (θ) may be adjusted beyond 125°.

FIGS. 9C through 9F show a side view of a cradle 901 before use, during use, and after use with a laptop 920 according to an aspect of the present disclosure.

Figure 9C:
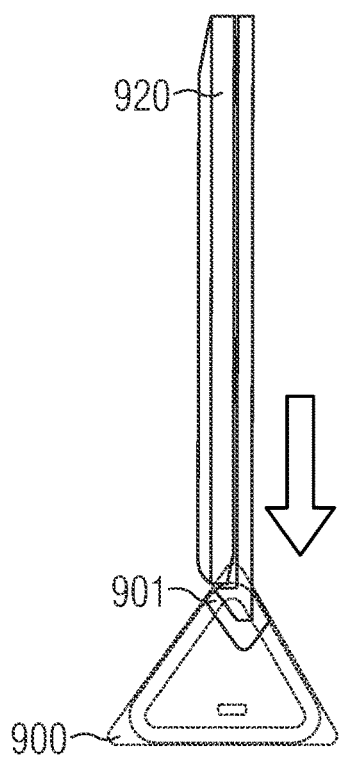
FIGS. 9C through 9F show a side view of a cradle before use, during use, and after use with a laptop according to an aspect of the present disclosure.

In FIG. 9C, a laptop 920 may be inserted vertically into the cradle 901 of a docking station 900.

Figure 9D:
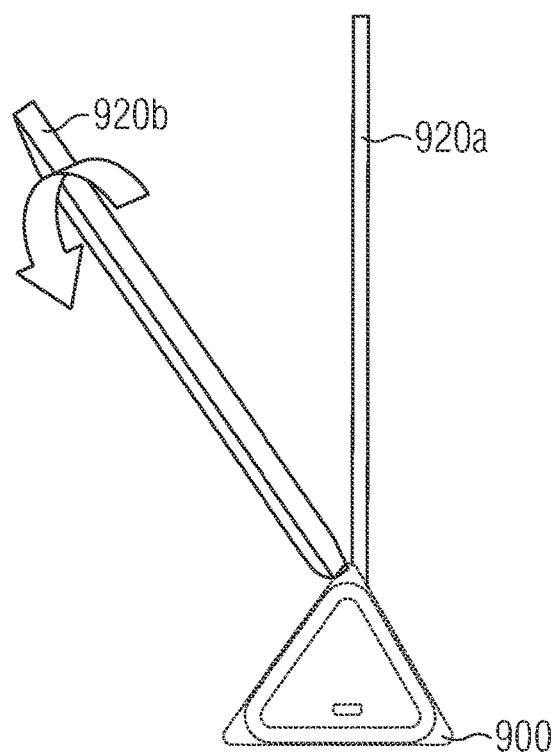
Figure 9E:
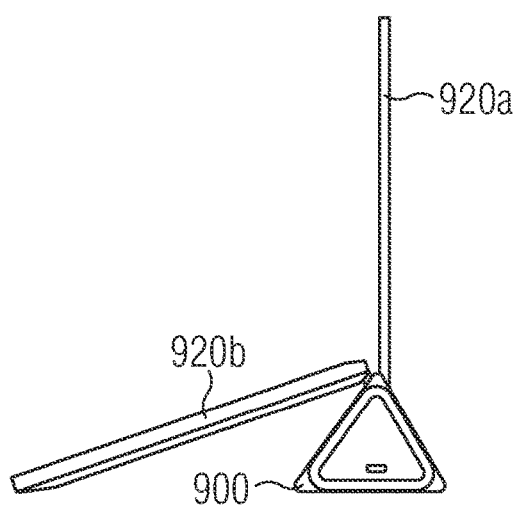

As shown in FIG. 9D, after inserting the laptop 920 into the cradle 901, the base 920b of the laptop 920 may be rotated down to rest on a surface such as a table. During this rotation of the base 920b, the lid 920a may remain in a vertical and locked position, as shown in FIG. 9E.

Figure 9F:
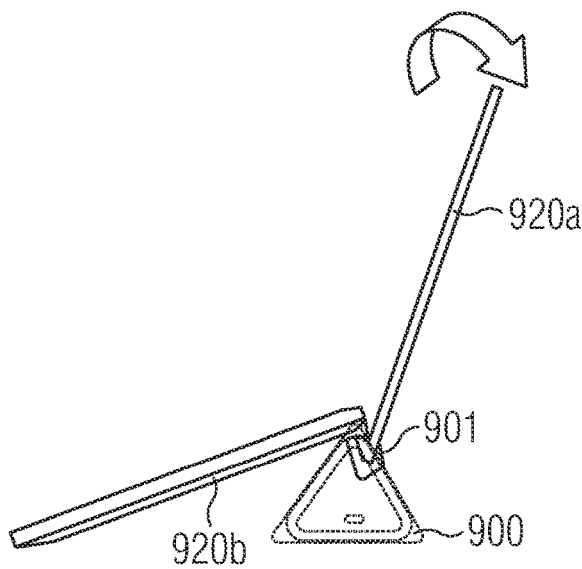

After the base 920b of the laptop 920 has been fully rotated down to rest on the table, the lid 920a may then be rotated or tilted to adjust the viewing angle, as shown in FIG. 9F. As the lid 920a tilts, the cradle 901 may also tilt in the same manner as the lid 920a.

Figure 10A:
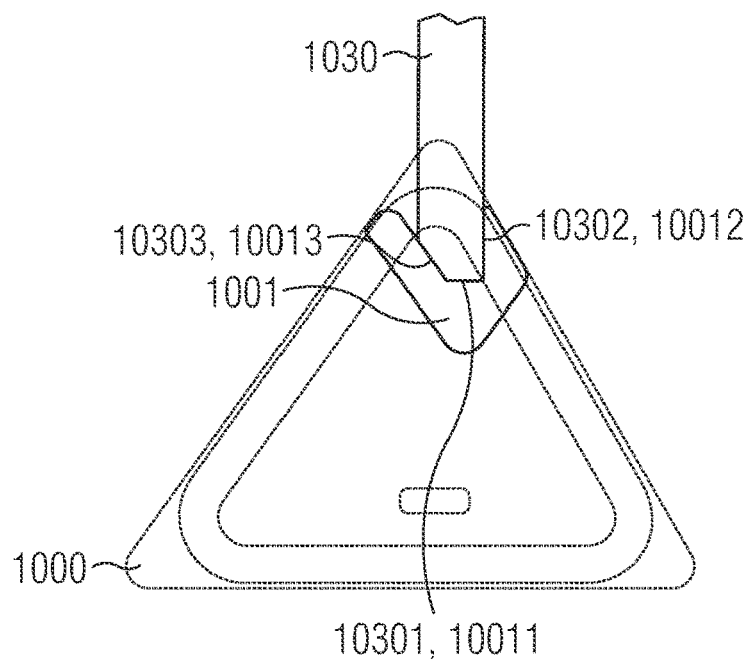
FIG. 10A shows an exploded side view of a cradle during use with a tablet according to an aspect of the present disclosure.

FIG. 10A shows an exploded side view of a cradle 1001 during use with a tablet 1030 according to an aspect of the present disclosure.

In the aspect shown in FIG. 10A, from a side view perspective, the tablet 1030 may include a bottom edge that may sit in the cradle 1001. A cross-section of the bottom edge may include a flat base 10301, a vertical sidewall 10302, and an inclined side wall 10303. The flat base 10301 may adjoin the vertical sidewall 10302 and the inclined side wall 10303. In one aspect, the cross-section of the tablet 1030 may include a 'hook' or "J" shape.

To receive the bottom edge of the tablet 1030, the cradle 1001 may be suitably shaped to correspond to the cross-section of the bottom edge. In one aspect, a cross-section of the cradle 1001 may include a flat base 10011, a vertical sidewall 10012, and an inclined side wall 10013. The flat base 10011 may adjoin the vertical sidewall 10012 and the inclined side wall 10013. In one aspect, the cross-section of the cradle 1001 may include a 'hook' or "J" shape.

Figure 10B:
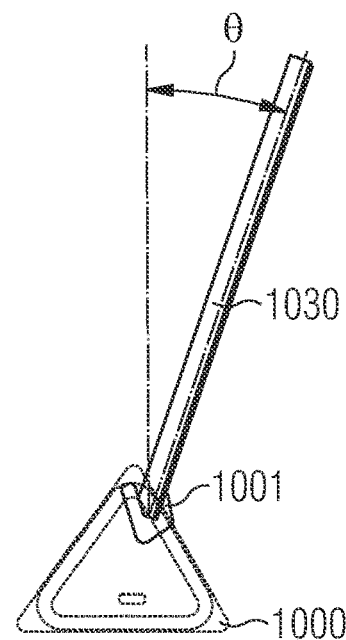
FIG. 10B shows a side view of a docking station during use with a tablet according to an aspect of the present disclosure.

FIG. 10B shows a side view of a docking station 1000 during use with a tablet 1030 according to an aspect of the present disclosure.

In the aspect shown in FIG. 10B, the tablet 1030 may be adjusted according to a choice of viewing angle (denoted by "θ") by a user. In one aspect, the viewing angle (θ) may be adjusted up to 125°. In other aspects, the view angle (θ) may be adjusted beyond 125°.

Figure 10C:
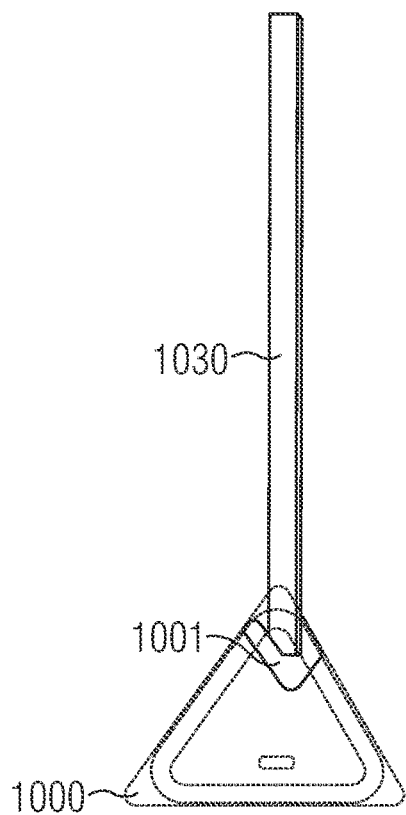
FIGS. 10C and 10D show a side view of a cradle before use and after use with a tablet according to an aspect of the present disclosure.
Figure 10D:
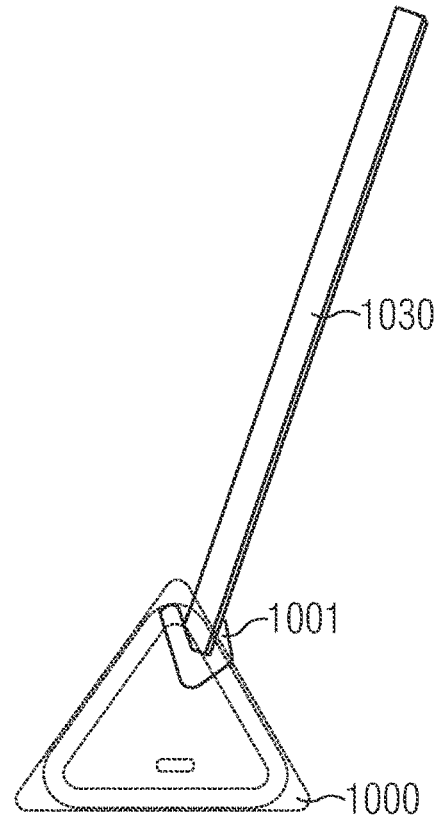

FIGS. 10C and 10D show a side view of a cradle 1001 before use and after use with a tablet 1030 according to an aspect of the present disclosure.

In FIG. 10C, the tablet 1030 may be inserted vertically into the cradle 1001 of a docking station 1000.

As shown in FIG. 10D, after inserting the tablet 1030 into the cradle 1001, the tablet 1030 may then be rotated or tilted to adjust the viewing angle. As the tablet 1030 tilts, the cradle 1001 may also tilt in the same manner as the tablet 1030.

Figure 11A:
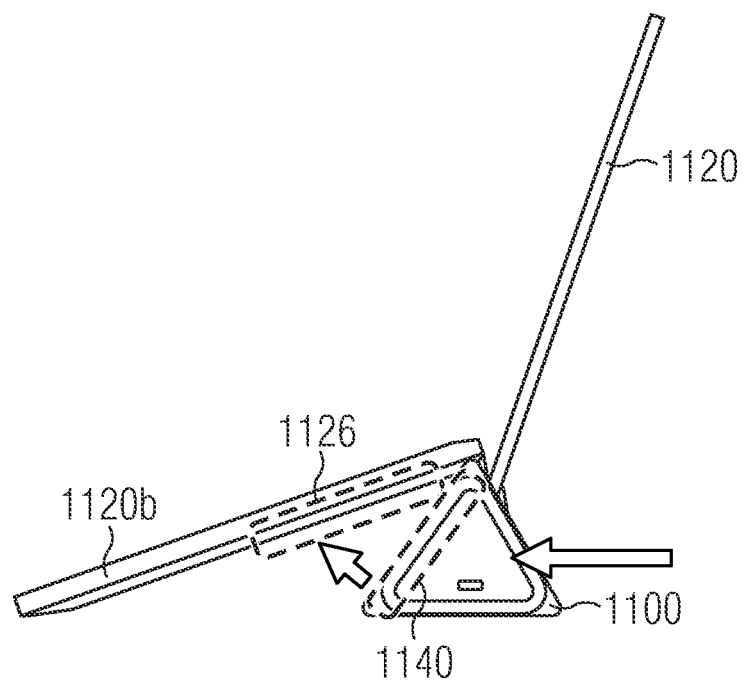
FIG. 11A shows a side view of a docking station including an axial fan according to an aspect of the present disclosure.

FIG. 11A shows a side view of a docking station 1100 including an axial fan 1140 according to an aspect of the present disclosure.

In an aspect, the docking station 1100 may further include the axial fan 1140 embedded therein. In other words, the axial fan 1140 may be arranged in an interior of the docking station 1100.

The axial fan 1140 may be arranged close to one side of the docking station 1100 that faces a base 1120b of a laptop 1120 when in use. By arranging the axial fan 1140 in this arrangement, inlet air may be sucked in and outlet air may be blown out by the axial fan 1140 in a direction of the arrow shown in FIG. 11A. In one aspect, the surfaces of the docking station 1100 may include a plurality of openings to allow the entry and exit of air.

In one aspect, a motherboard 1126 of a laptop 1120 may be located at an upper section of the laptop base 1120b. One advantage of the present disclosure may include providing a cooling capability to the docking station 1100 by embedding at least one axial fan 1140 in the interior of the docking station 1100.

Figure 11B:
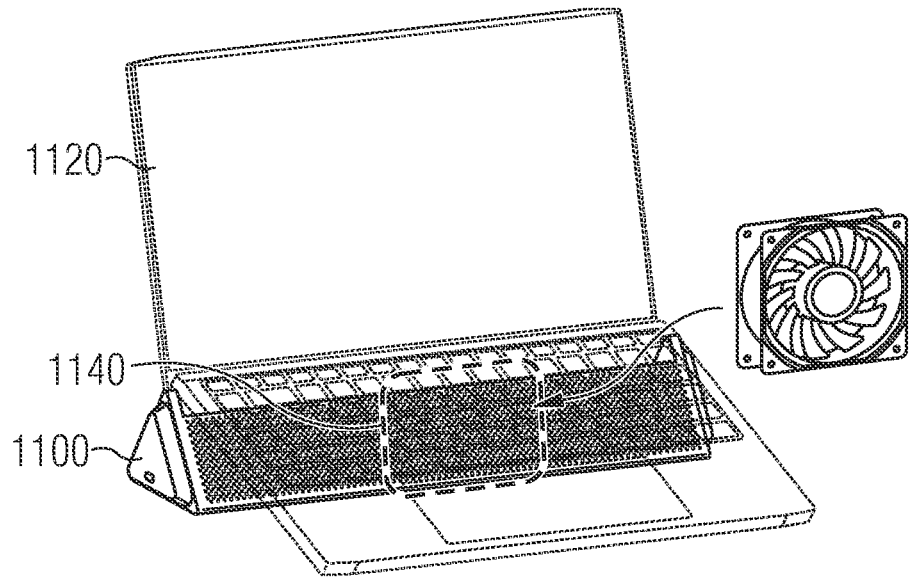
FIG. 11B shows a perspective view of a docking station including an axial fan according to the aspect shown in FIG. 11A.

FIG. 11B shows a perspective view of a docking station 1100 including an axial fan 1140 according to the aspect shown in FIG. 11A, when viewed from the front of the laptop 1120.

An actual photo of an exemplary axial fan suitable for use in the docking station 1100 may be seen in FIG. 11B.

Figure 12A:
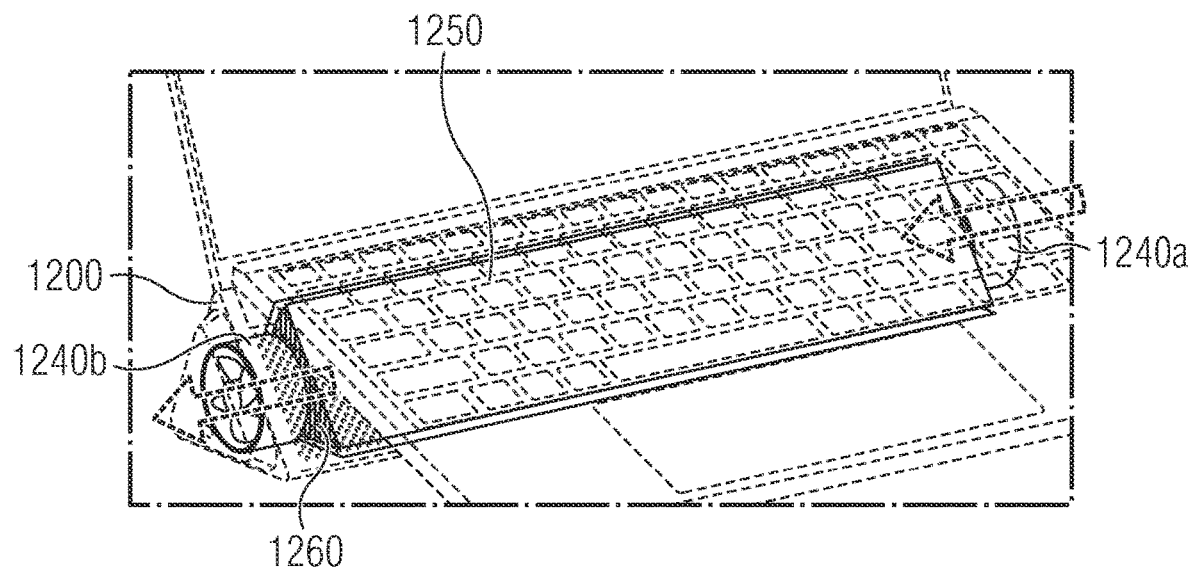
FIG. 12A shows a perspective view of a docking station including an internal cooling system and an internal printed circuit board (PCB) according to one aspect of the present disclosure.

FIG. 12A shows a perspective view of a docking station 1200 including an internal cooling system and an internal printed circuit board (PCB) 1250 according to one aspect of the present disclosure.

In one aspect, the docking station 1200 may include an internal PCB 1250. The internal PCB 1250 may be foldable to conform to the triangular cross-section of the docking station 1200. For example, the triangular PCB 1250 may be formed by three pieces of rigid boards connected by flexible materials at a respective folding side of the rigid boards. In one aspect, the foldable PCB 1250 may include high power components such as Intel® Xe graphic chips. In another aspect, the high power components may include storage devices. In further aspects, the high power components may include an additional central processing unit (CPU) for parallel computing. In one aspect, the docking station including the high power components may be used as an independent cloud device when not docked, as the cooling capability of the docking station could be much better than most mobile devices, as explained below.

In one aspect, the docking station 1200 may further include an internal cooling system, operated to cool the foldable PCB 1250 during operation. The internal cooling system may include a vapor chamber 1270 and a heat exchanger 1260. Axial fans (1240a, 1240b) may be provided at both ends of the docking station 1200 to regulate airflow in the docking station 1200. Cool air may be sucked in, pass through the internal cooling system, and exit the docking station 1200 as hot air in a direction shown in FIG. 12A.

Figure 12B:
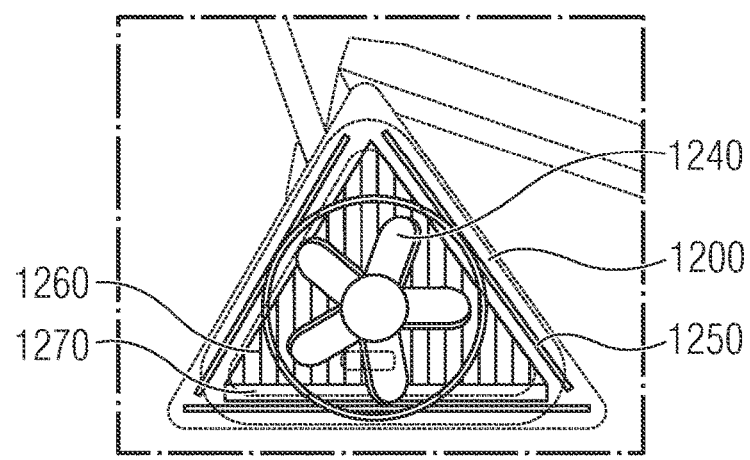
FIG. 12B shows a side view of the docking station according to the aspect shown in FIG. 12A.

FIG. 12B shows a side view of the docking station 1200 according to the aspect shown in FIG. 12A.

An internal cooling system including a vapor chamber 1270 and a heat exchanger 1260 may be arranged in the interior of the docking station 1200 as shown in FIG. 12B. The vapor chamber may be arranged at the bottom of the internal cooling system. The folder PCB 1250 may surround the internal cooling system.

In all aspects of the present disclosure, the docking station may include additional connection interfaces not found in the cradle, such as power outlets, HDMI (High-Definition Multimedia Interface) ports, or optical connections.

Examples

Example 1 may include a docking station including a triangular prism shaped body and a cradle proximal to a top section of the triangular prism shaped body for detachably receiving a mobile device, wherein the cradle may include a plurality of different connection interfaces to provide a selectable connection with a complementary connection interface of the mobile device.

Example 2 may include the docking station of example 1 and/or any other example disclosed herein, wherein the cradle further includes a plurality of fixed different connection interfaces, each including a predetermined connection interface.

Example 3 may include the docking station of example 2 and/or any other example disclosed herein, wherein the cradle further includes a recess to accommodate the plurality of fixed different connection interfaces.

Example 4 may include the docking station of example 3 and/or any other example disclosed herein, wherein the cradle further includes a selective activation mechanism in the recess to expose one of the plurality of fixed different connection interfaces for connection with a complementary connection interface of a mobile device.

Example 5 may include the docking station of example 4 and/or any other example disclosed herein, wherein the cradle further includes a raised section in the recess to allow one of the plurality of fixed different connection interfaces to become exposed by sliding by the raised section.

Example 6 may include the docking station of example 1 and/or any other example disclosed herein, wherein the cradle further includes a plurality of swappable different connection interfaces.

Example 7 may include the docking station of example 1 and/or any other example disclosed herein, wherein the plurality of different connection interfaces includes a combination of two or more interfaces selected from the group consisting of a USB port, a pogo pin connector, a wireless high-speed connector, and an OEM port.

Example 8 may include the docking station of example 1 and/or any other example disclosed herein, wherein the cradle is hinged to the top section of the triangular prism shaped body.

Example 9 may include the docking station of example 1 and/or any other example disclosed herein, wherein the cradle is rotatable with respect to a longitudinal axis of the triangular prism shaped body.

Example 10 may include the docking station of example 9 and/or any other example disclosed herein, wherein the cradle is rotatable up to 125° with respective to a vertical axis passing through the cradle.

Example 11 may include the docking station of example 1 and/or any other example disclosed herein, wherein the cradle further includes a flat base, a vertical sidewall, and an inclined sidewall.

Example 12 may include the docking station of example 1 and/or any other example disclosed herein, further including one or more axial fan arranged in an interior of the triangular prism shaped body.

Example 13 may include the docking station of example 1 and/or any other example disclosed herein, further including an internal cooling system arranged in an interior of the triangular prism shaped body.

Example 14 may include the docking station of example 13 and/or any other example disclosed herein, wherein the internal cooling system further includes a vapor chamber.

Example 15 may include the docking station of example 13 and/or any other example disclosed herein, wherein the internal cooling system further includes a heat exchanger.

Example 16 may include the docking station of example 13 and/or any other example disclosed herein, further includes at least one axial fan attached to one end of the triangular prism shaped body.

Example 17 may include the docking station of example 1 and/or any other example disclosed herein, further includes a printed circuit board arranged in an interior of the triangular prism shaped body.

Example 18 may include the docking station of example 13 and/or any other example disclosed herein, wherein the printed circuit board further includes high power components.

Example 19 may include the docking station of example 18 and/or any other example disclosed herein, wherein the high power components further include graphic chips, storage devices, or additional central processing units.

Example 20 may include the docking station of example 1 and/or any other example disclosed herein, wherein the triangular prism shaped body is retractable or extendable.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:
1. A docking station comprising:
   a triangular prism shaped body; and
   a cradle proximal to a top section of the triangular prism shaped body for detachably receiving a mobile device, wherein the cradle comprises a plurality of different connection interfaces to provide a selectable connection with a complementary connection interface of the mobile device;
   wherein the cradle further comprises a recess and a selective activation mechanism in the recess to expose one of the plurality of different connection interfaces for connection with a complementary connection interface of the mobile device; and
   wherein the cradle further comprises a raised section in the recess to allow one of the plurality of different connection interfaces to become exposed via the selective activation mechanism by sliding to the raised section.

2. The docking station of claim 1, wherein the plurality of different connection interfaces is or comprises a plurality of fixed different connection interfaces, each comprising a predetermined connection interface.

3. The docking station of claim 2, wherein the cradle further comprises a recess to accommodate the plurality of fixed different connection interfaces.

4. The docking station of claim 1, wherein the cradle further comprises a plurality of swappable different connection interfaces.

5. The docking station of claim 1, wherein the plurality of different connection interfaces comprises a combination of two or more interfaces selected from the group consisting of a USB port, a pogo pin connector, a wireless high-speed connector, and an OEM port.

6. The docking station of claim 1, wherein the cradle is hinged to the top section of the triangular prism shaped body.

7. The docking station of claim 1, wherein the cradle is rotatable with respect to a longitudinal axis of the triangular prism shaped body.

8. The docking station of claim 7, wherein the cradle is rotatable up to 125° with respective to a vertical axis passing through the cradle.

9. The docking station of claim 1, wherein the cradle further comprises a flat base, a vertical sidewall, and an inclined sidewall.

10. The docking station of claim 1, further comprising one or more axial fan arranged in an interior of the triangular prism shaped body.

11. The docking station of claim 1, further comprising an internal cooling system arranged in an interior of the triangular prism shaped body.

12. The docking station of claim 11, wherein the internal cooling system further comprises a vapor chamber.

13. The docking station of claim 11, wherein the internal cooling system further comprises a heat exchanger.

14. The docking station of claim 11, further comprises at least one axial fan attached to one end of the triangular prism shaped body.

15. The docking station of claim 1, further comprises a printed circuit board arranged in an interior of the triangular prism shaped body.

16. The docking station of claim 11, wherein the printed circuit board further comprises high power components.

17. The docking station of claim 16, wherein the high power components further comprise graphic chips, storage devices, or additional central processing units.

* * * * *